US009292970B2

(12) United States Patent
Gary

(10) Patent No.: US 9,292,970 B2
(45) Date of Patent: Mar. 22, 2016

(54) SYSTEMS AND METHODS OF RETOPOLOGIZING GRAPHICAL DATA

(75) Inventor: Crocker Gary, San Diego, CA (US)

(73) Assignee: IntegrityWare, Inc., San Diego ( * ) Notice: Subject to any disclaimer, the term of this patent is extended or adjusted under 35 U.S.C. 154(b) by 298 days.

(21) Appl. No.: 13/447,111

(22) Filed: Apr. 13, 2012

(65) Prior Publication Data

US 2013/0275089 A1    Oct. 17, 2013

(51) Int. Cl.
*G06G 7/48* (2006.01)
*G06T 17/20* (2006.01)

(52) U.S. Cl.
CPC .................................. *G06T 17/205* (2013.01)

(58) Field of Classification Search
CPC ......... G06T 15/30; G06T 15/00; G06T 15/10; G06T 17/00; G06T 17/20; G06T 13/00; G06K 9/00; G06K 9/46; G06F 17/50; G06F 17/5009; G06F 17/10; G06F 3/00; G06F 15/16; G06F 19/00; G06F 7/00; G06F 17/30; A61C 7/00; A61C 7/08; A61F 2/28; G06G 7/60; B23P 11/00; G09G 5/00; G01B 5/008; G06Q 50/00
USPC .................... 703/6, 7; 345/420, 423; 382/128
See application file for complete search history.

(56) References Cited

U.S. PATENT DOCUMENTS

| 6,356,263 | B2 * | 3/2002 | Migdal et al. ................ 345/423 |
| 2007/0030268 | A1 * | 2/2007 | Nigro ............................ 345/420 |
| 2007/0296719 | A1 * | 12/2007 | Sander et al. ................ 345/423 |
| 2010/0290679 | A1 * | 11/2010 | Gasser et al. ................ 382/128 |

* cited by examiner

*Primary Examiner* — Kandasamy Thangavelu

(57) ABSTRACT

Systems and methods of updating graphical objects are disclosed. The methods and systems receive polygonal data which described points on an object. A user indicates a length, and retopologized data for a region is automatically generated based on the length such that the retopologized data has fewer geometries than the received polygonal data in the region.

30 Claims, 8 Drawing Sheets

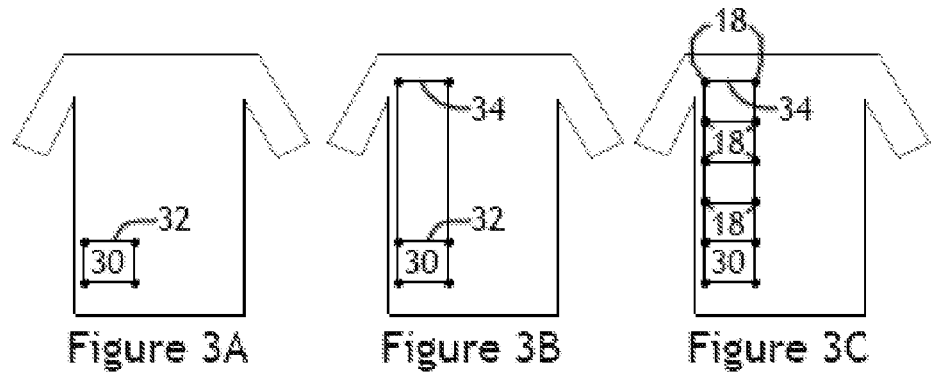
Figure 3A  Figure 3B  Figure 3C
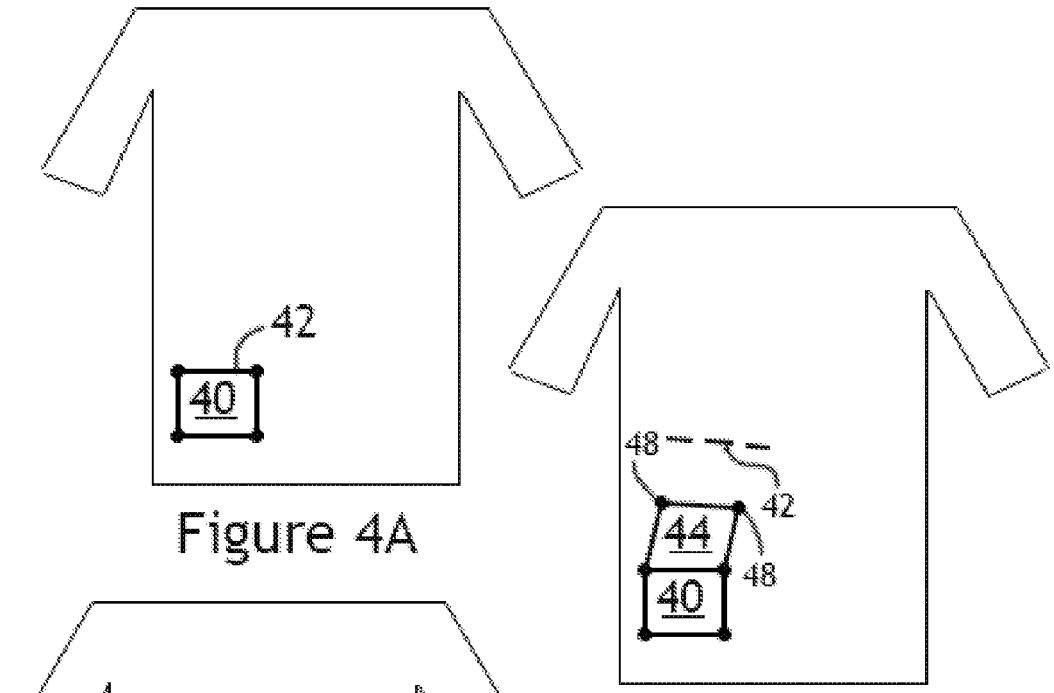
Figure 4A
Figure 4B
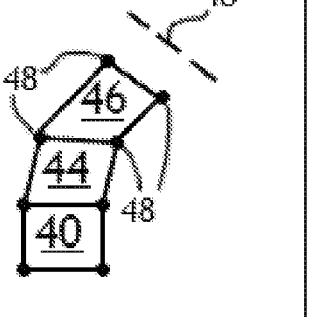
Figure 4C

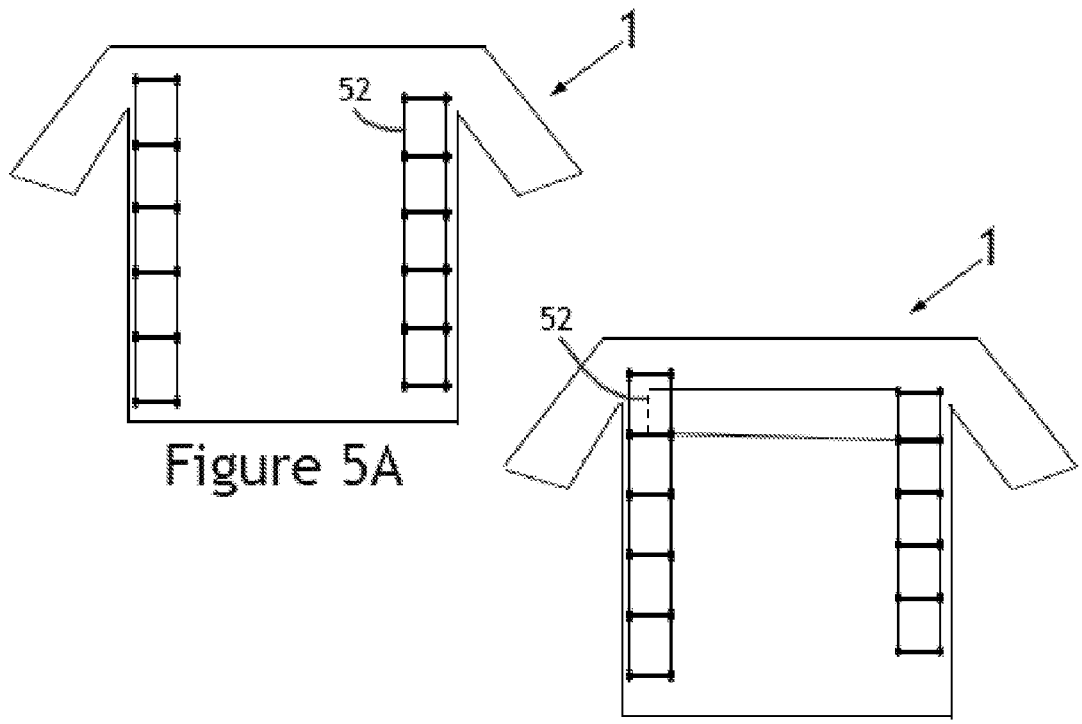
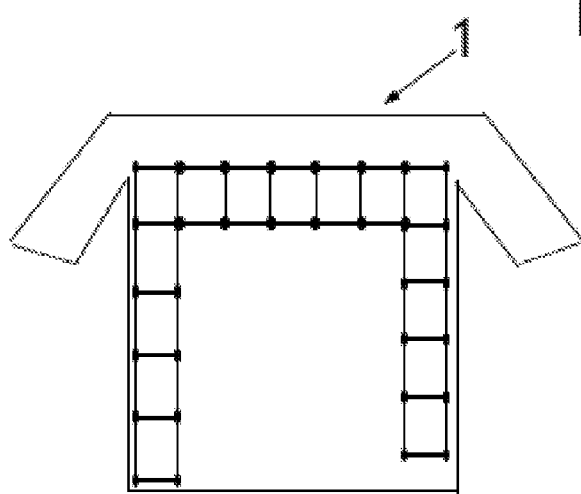
Figure 5A
Figure 5B
Figure 5C

SYSTEMS AND METHODS OF RETOPOLOGIZING GRAPHICAL DATA

BACKGROUND

1. Field

The described technology relates to systems and methods of retopologizing graphical information representing a polygonal data object.

2. Description of the Related Technology

Polygonal model data is created with, for example a 3-D CAD software tool by, for example, a designer. Polygonal model data may alternatively be created by or with a scanning system which scans an object and creates data representing the surface of the object. The polygonal model or polygonal mesh includes discrete data points describing one or more surfaces or objects. The polygonal (or geometric) model, or data object, includes a number of geometrics, such as vertices, edges, and faces. Polygonal models are convenient for design work at least because they define the surface or object with a degree of detail convenient for the designer to work with. The shape of the surface or object is described by the data points, and the surface between the data points is perceived, but is not necessarily represented in the data. This allows for the CAD system to function quicker because of a significantly reduced data set representing the surface or object, while providing the designer enough detail to perceive and manipulate to achieve a desired design.

The polygonal data may be edited by a designer according to the designer's purposes. For example, the designer may add features to the object represented by the polygonal data using mesh operations. In addition, to create smooth, natural looking objects, a smoothing algorithm may be used to modify the polygonal data. For example, a Catmull-Clark algorithm or a Loop subdivision algorithm may be performed on the polygonal data. The smoothing algorithm modifies the polygonal data by, for example, adding vertices and repositioning existing vertices. Thus, the smoothing algorithm generates a modified object.

Typically, certain polygonal data is preferred for editing or smoothing. For example, polygonal data having predominantly quadrilateral faces with vertices predominantly connected to four edges may be preferred. In addition, for convenience in editing and computer system data management, the polygonal data may preferably have geometry density commensurate with the topological variation in each region of the model. For example a substantially planar region would preferably have fewer geometries per unit area than a region which has intricate topological detail.

Retopologizing may be performed to convert polygonal data of a less desirable constitution to a more preferred state. Data having many small triangular faces such as a scanned mesh generated by a scanning system may be retopologized to create a mesh having significantly fewer quadrilateral faces. Brep data, subdivided data, a triangular mesh, volumetric representation data, quad-tree data, oct-tree data, or other data may also be preferably retopologized.

In some embodiments of retopologizing, the process is manual, where a user selects locations for geometries, such as vertices, of the retopologized data. The designer indicates to the computer system locations for added vertices in the plane of view as displayed, and the computer system causes the added vertices to be on the surface of the object being retopologized. Each vertex may be individually placed, and faces generated based on the placed vertices. Such a process is cumbersome and slow.

SUMMARY OF CERTAIN INVENTIVE ASPECTS

One aspect is a method of producing an electronic geometric model with a computer system. The method includes accessing electronic data, where the data includes polygonal data representing a surface. The method also includes receiving an indication from a user, where the indication communicates a length, and in response to the indication, automatically retopologizing a region of the polygonal data. The automatically retopologized region comprises a plurality of faces and a plurality of edges, and one or more of the edges has a length based on the length of the indication.

BRIEF DESCRIPTION OF THE DRAWINGS

FIGS. 3A-3C are illustrations at various stages of an embodiment of a process of generating a retopologized model corresponding to a polygonal data object.

FIGS. 4A-4C are illustrations at various stages of an embodiment of a process of generating a retpologized model corresponding to a polygonal data object.

FIGS. 5A-5C are illustrations at various stages of an embodiment of a process of generating a retopologized model corresponding to a polygonal data object.

DETAILED DESCRIPTION OF CERTAIN INVENTIVE EMBODIMENTS

Various aspects and features of methods and systems are described herein with reference to the accompanying drawings, which show certain exemplary embodiments. The described embodiments may be modified in various ways, without departing from the spirit or scope of the present invention or inventions. In addition, the described embodiments have multiple features and aspects, no single one of which is solely responsible for the desirable characteristics of the embodiments. Furthermore, no single feature or aspect is essential to practicing the methods and systems described herein. Furthermore, various features and aspects of the embodiments may be combined in embodiments not specifically described.

Various inventive aspects of certain embodiments of methods and systems for generating and graphically rendering smoothed polygonal data objects are discussed. The methods and systems access polygonal data which describe discrete points of a geometric object. The methods and systems may use a smoothing algorithm, such as, but not limited to, a Catmull-Clark or Loop subdivision algorithm to smooth the geometric object. The smoothed version of the polygonal data my be simultaneously displayed with a representation of the polygonal data. A designer may modify the polygonal data using a CAD software tool running on a computer system. As the polygonal data is modified, the smoothed version may be automatically updated in response to the modification.

Figure 1A:
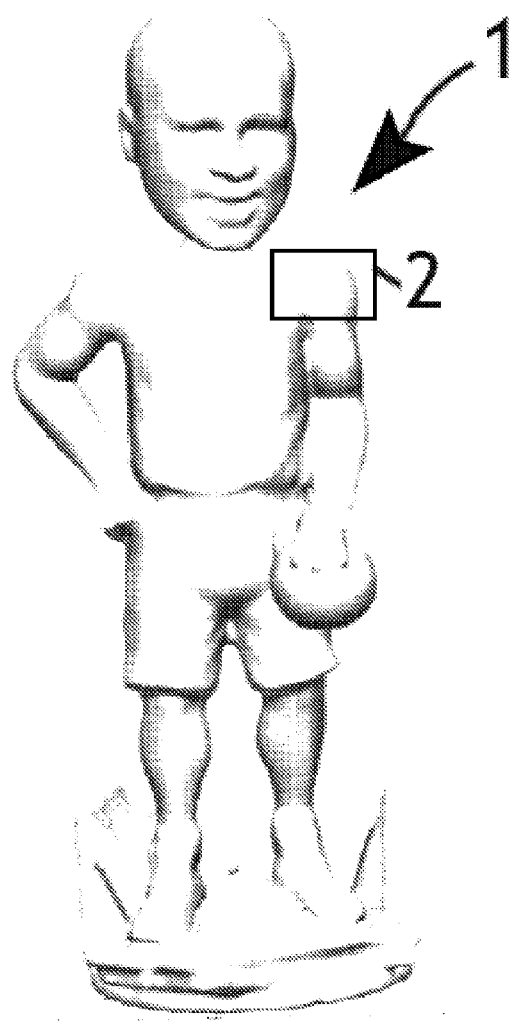
FIGS. 1A and 1B are illustrations of a data object which may be retopologized.
Figure 1B:
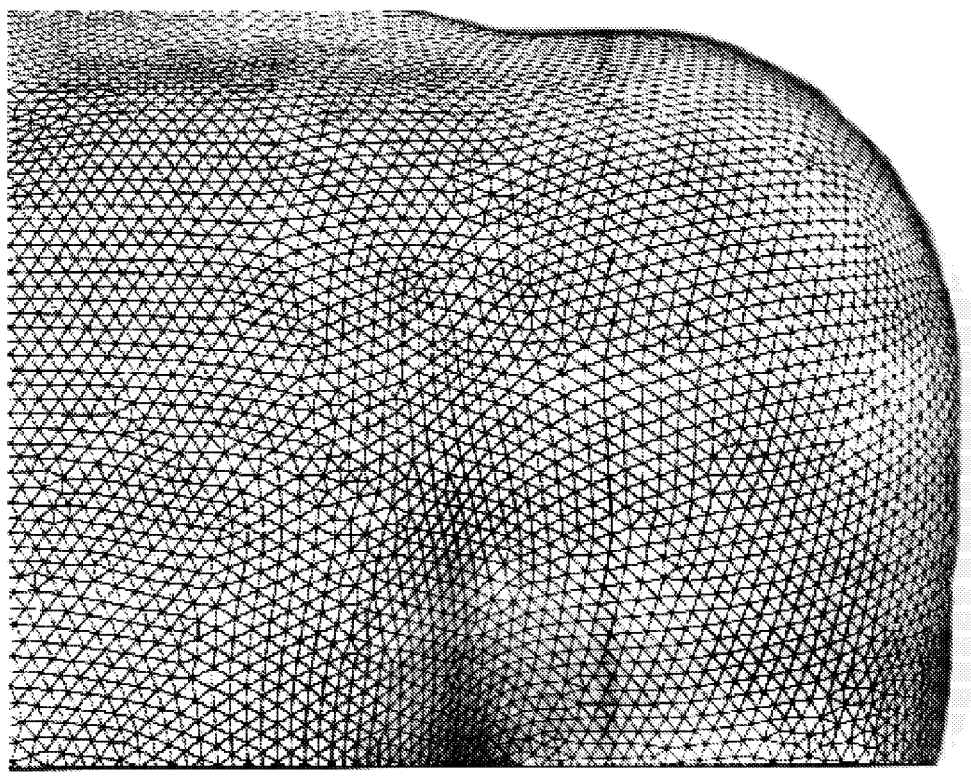

For example, the methods and systems may access electronic data which describes polygonal data object 1, such as that represented in FIG. 1A. In this example, the polygonal data object 1 is scanned mesh of an objected scanned by a scanning system. As shown in a region 2 in FIG. 1B, there are numerous geometrics and the faces are predominantly triangular. For design work to be performed on the model, the polygonal data object 1 is preferably retopologized.

Figure 2A:
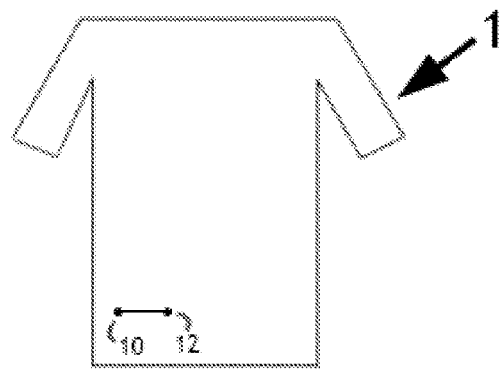
FIGS. 2A-2F are illustrations at various stages of an embodiment of a process of generating a retopologized model corresponding to a polygonal data object.
Figure 2B:
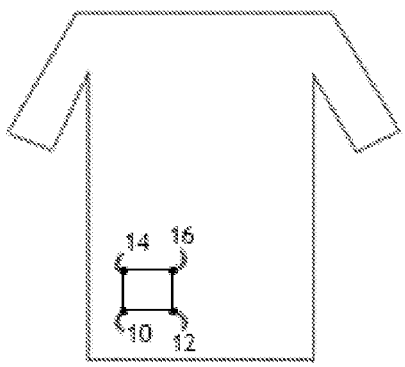

FIGS. 2A-2F are illustrations at various stages of an embodiment of a process of generating a retopologized model corresponding to polygonal data object 1. FIG. 2A shows first and second vertices 10 and 12, which have been placed by the user. The first and second vertices 10 and 12 and the edge connecting them are the initial data of the retopologized model. The computer system ensures that the vertices 10 and 12 are substantially on the data object 1. In some embodiments, in response to the placement of the latter of the first and second vertices 10 and 12, or in the response to another indication, the computer system determines locations for and adds two additional vertices 14 and 16, shown in FIG. 2B. In some embodiments, the placement of the latter of the first and second vertices causes the computer system to add the vertices 14 and 16. In some embodiments, a separate indication causes the computer system to add the vertices 14 and 16.

The placement of vertices 14 and 16 is determined by the computer system based on data of object 1 and on the locations of the first and second vertices 10 and 12. For example, the computer system may determine that the data object 1 has less topology than a threshold in the region encompassed by the vertices 10, 12, 14, and 16. For example, the computer system may compare gradients in the region to a threshold to determine whether the topology is less than a threshold. In this embodiment, vertices 10, 12, 14, and 16 define a square or substantially square quadrilateral having edges of length equal to or similar to the length of the edge between vertices 10 and 12, as placed by the designer.

Figure 2C:
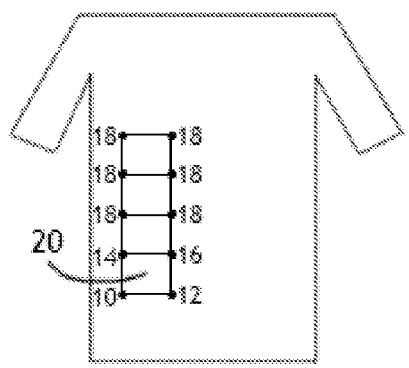

In some embodiments, the computer system may similarly place additional vertices so as to retopologize additional regions of data object 1. For example, FIG. 2C shows additional vertices 18 and associated edges and faces which have been added. In this embodiment, additional vertices 18 define square or substantially square quadrilaterals having edges of length equal to or similar to the length of the edge between vertices 10 and 12. In this example, the computer system places additional vertices 18 so as to generate a series of continuous additional faces which extend from and have similar size and shape as the face 20 defined by vertices 10, 12, 14, and 16.

In some embodiments, the series of additional faces continues until a next additional face would encompass a region having topology greater than the threshold. In some embodiments, additional vertices are placed so as to create a face which has an edge near the high topology region. Such placement may generate a face which has a size or shape which is different from the size or shape of face 20. In such embodiments, the additional vertices 18 and the added vertices 14 and 16 may be adjusted so that the faces defined by vertices 10, 12, 14, 16, and 18 have substantially the same or similar size and shape.

Figure 2D:
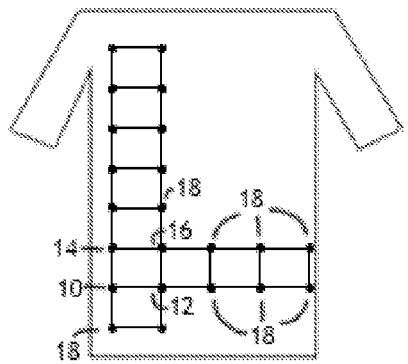

In some embodiments, the computer system generates a series of additional faces as discussed herein in each direction from the face defined by vertices 10, 12, 14, and 16. Such additional faces are shown in FIG. 2D. In this example, a face is not generated in one direction from face 20 because the computer system determines that the data object 1 has a region of high topology in that direction. In some embodiments, the computer system moves vertices 10 and 14 so as to be close to the region of high topology.

Figure 2E:
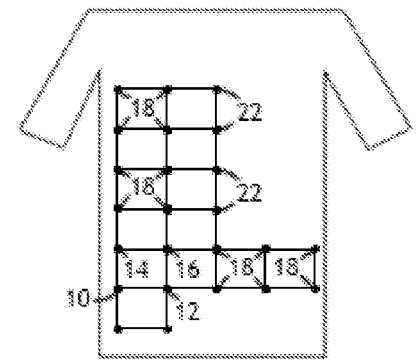

In some embodiments, the computer system generates and places additional vertices 22 so as to generate one or more additional series of faces which are adjacent to the series which are generated by the addition of vertices 18, as illustrated in FIG. 2D. One such additional series is shown in FIG. 2E. As shown, the additional series uses previously generated edges and vertices.

Figure 2F:
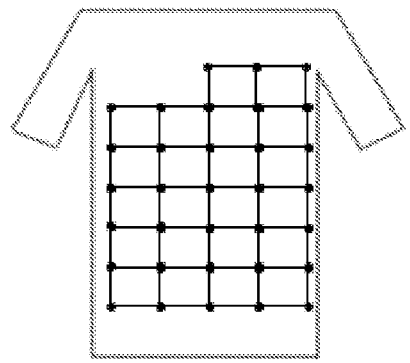

In some embodiments, the computer system, continues to place additional vertices 22 so as to generate additional series of faces similar to those discussed herein. In some embodiments additional vertices are generated and placed by the computer system until substantially the entire region bounded by regions of high topology is filled with retopologized data, such as shown in FIG. 2F.

In some embodiments, the region filled with retopologized data automatically generated as discussed herein may be entirely or partly bounded by previously retopologized regions of data instead of regions of high topology. In such embodiments, the computer system determines placement of additional vertices and lengths of edges of the automatically generated retopologized data partly based on the edge lengths and vertex positions of the previously retopologized regions. In some embodiments, the region filled with retopologized data automatically generated as discussed herein may be entirely or partly bounded by a perimeter of data object 1.

In some embodiments, vertices 14, 16, 18, and 22, and the edges and faces associated therewith are automatically generated and placed by the computer system in response to the placement of vertices 10 and 12 by the designer.

In some embodiments, retopologized data exists and in response to an action by the designer, additional retopologized data is generated, for example, similarly to that described herein. For example, after vertices 10 and 12 have been placed, an edge connecting vertices 10 and 12 may be selected and dragged and placed to indicate placement of additional vertices 14 and 16. In such embodiments, additional vertices 18 and 22 may be additionally generated as discussed herein.

In some embodiments, a face of retopologized data exists and in response to an action by the designer, additional retopologized data is generated, for example, similarly to that described herein. For example, after face 30 has been generated, as shown in FIG. 3A, an edge 32 may be selected and dragged and placed to indicate placement of the edge 34 of a series of additional faces farthest from the face 30, as shown in FIG. 3B. In response to the placement of the edge 34, using, for example one or more aspects discussed herein, the computer system may generate additional vertices 18 such that the series has faces which are substantially the same size and shape as face 30, as shown in FIG. 3C.

In some embodiments, multiple edges may be selected and dragged and released. In response to the action, the computer system generates multiple series of retopologized faces similar to those discussed herein with reference to FIGS. 3A-3C. In some embodiments, additional vertices 18 and 22 may be additionally generated using one or more aspects discussed herein.

In some embodiments, as an edge of an existing polygon is dragged, the computer system generates and displays additional vertices and edges defining additional faces each time the edge is dragged an additional unit distance. In some embodiments, the displayed additional vertices and edges are graphical and are entered into a database of the retopologized data based only after receiving an indication from the designer. Accordingly, the designer sees additional retopologized faces to be created as a result of the movement of the dragged edge.

FIGS. 4A-4C are illustrations at various stages of an embodiment of a process of generating a retopologized model corresponding to polygonal data object 1. As shown in FIG. 4A, face 40 has edge 42. Once edge 42 or another geometry is selected and dragged a distance greater than a threshold about equal to the lengths of the edges of face 40, as shown in FIG. 4B, the computer system creates and places additional vertices 48 so that an additional retopologized face 44 is generated. Once the edge 42 is further dragged another distance greater than the threshold, as shown in FIG. 4C, the computer system creates and places additional vertices 48 so that an additional retopologized face 46 is generated. As shown, the path of the series of faces generated by dragging the edge 42 is selected by the designer and, in this example is curved.

In some embodiments, when the edge 42 is released, an additional face is generated having an edge in the location of the released edge 42. In such embodiments, the computer system may adjust the positions of the additional vertices 48 so that each of the faces of the series of faces generated by dragging the edge 42 have similar sizes. In some embodiments, when the edge 42 is released, only the concurrently displayed additional vertices 48 and their associated edges and faces remain and are added to the database.

In some embodiment, multiple edges may be selected and dragged and released. In response to the action, the computer system generates multiple series of retopologized faces similar to those discussed herein with reference to FIGS. 4A-4C. In some embodiments, additional vertices similar to vertices 18 and 22 discussed herein, may be additionally generated using aspects similar one or more aspects discussed herein.

FIGS. 5A-5C are illustrations at various stages of an embodiment of a process of generating a retopologized model corresponding to polygonal data object 1. In some embodiments, multiple regions of retopologized data exists and in response to an action by the designer, additional retopologized data is generated, for example, similarly to that described herein. For example, after two regions of retopologized data have been generated, as shown in FIG. 5A, an edge 52 from one region may be selected and dragged and placed on the other region to retopologized the data 1 between the two regions, as shown in FIG. 5B.

In some embodiments, once the edge 52 is released on the other retopologized region, the computer system determines positions for and places additional vertices, edges, and faces to retopologized the data 1 between the face from which edge 52 originated and the face on which the dragged edge 52 was released, as shown in FIG. 5C. As shown, the additional geometries are generated so that the widths of the additional faces are similar to their heights. In addition, their heights gradually transition from one previously retopologized region to the other.

In some embodiments, multiple edges from one previously retopologized region may be selected and dragged to another retopologized region. In response to the action, the computer system retopologizes the region between the faces from which the edges originated and the faces to which the edges are dragged according to aspects similar to those discussed herein. In some embodiments, additional vertices similar to vertices 18 and discussed herein, may be additionally generated using aspects similar one or more aspects discussed herein.

Figure 6A:
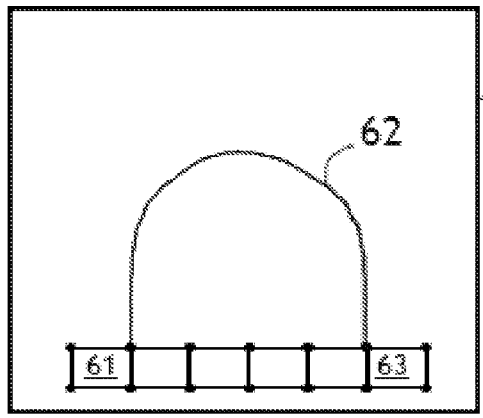
FIGS. 6A and 6B are illustrations at various stages of an embodiment of a process of generating a retopologized model corresponding to a polygonal data object.
Figure 6B:
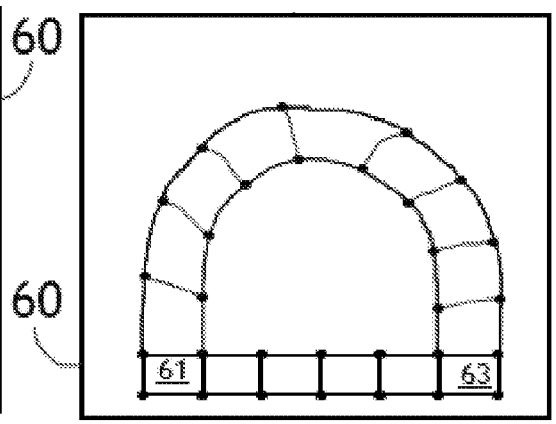

FIGS. 6A-6B are illustrations as various stages of an embodiment of a process of generating a retopologized model from data object 60. In this embodiment a reference curve 62, as shown in FIG. 6A, is drawn by the designer before a next region is retopologized. The reference curve 62 defines a flow line to which vertices of the retopologized region are constrained.

After the reference curve 62 is drawn, the region along the reference curve 62 is retopologized, for example, in response to an indication from the designer. In some embodiments, the designer provides an indication to the computer system, where the indication communicates that face 61 and face 63 are to be the start and end geometries of the region to be retopologized, and in response, the computer system retopologizes the region along the reference curve 62 according to, for example, aspects of methods discussed herein.

FIG. 6B shows an embodiment of the retopologized region. In this Embodiment, the length and width of the faces of the retopologized region along the curve 62 is determined by the computer system based on, for example, corresponding dimensions of the faces 61 and 63.

In some embodiments, to provide the indication, the designer mouse clicks on each of faces 61 and 63. Alternatively, the designer may mouse click on either of faces 61 and 63, hold the mouse button down, and release the mouse button on the other of faces 61 and 63. Other actions may be used to provide the indication.

In some embodiments, a reference curve is not used. In such embodiments, the designer may mouse click on either of faces 61 and 63, hold the mouse button down, traverse a curve with the mouse cursor, and release the mouse button on the other of the faces 61 and 63. The curve traversed by the mouse cursor after mouse clicking and before releasing the mouse button defines a path for the series of retopologized faces from face 61 to face 63. In some embodiments the path defines or approximately defines a center path for the series. In some embodiment, the path defines or approximately defines a flow line for edges of the series of retopologized faces. Accordingly, the designer may quickly retopologize a region of data using the computer system by mouse clicking on a first face, using a paint stroke action to define a retopologizing path, and releasing the mouse button on a second face. In response to the actions from the designer, the computer system retopologizes a region along the path defined by the paint stroke by generating retopologized faces having similar size and shape as the first and second faces.

Figure 7A:
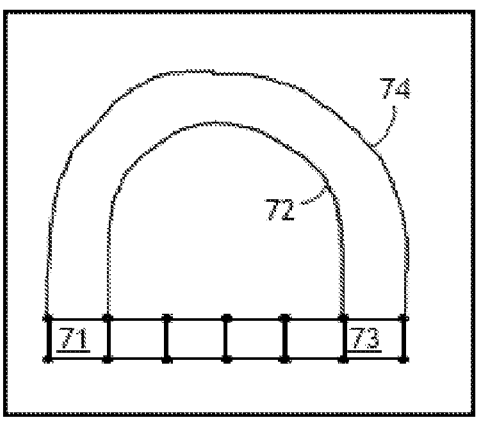
FIGS. 7A-7D are illustrations at various stages of an embodiment of a process of generating a retopologized model corresponding to a polygonal data object.

FIG. 7A-7D are illustrations at various stages of an embodiment of a process of generating a retopologized model from data object 70. In this embodiment, reference curves 72 and 74, as shown in FIG. 7A, are drawn by the designer before a next region is retopologized. The reference curves 72 define flow lines to which vertices of the retopologized region are constrained.

After the reference curves 72 and 74 are drawn, the region along the reference curves 72 and 74 are retopologized, for example, in response to an indication from the designer. In some embodiments, the designer provides an indication to the computer system, where the indication communicates that face 71 and face 73 are to be the start and end geometries of the region to be retopologized, and in response, the computer system retopologizes the region along the reference curves 72 and 74 according to, for example, aspects of methods discussed herein.

Figure 7B:
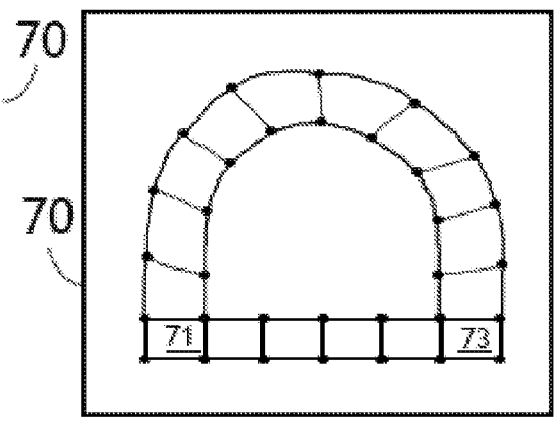

FIG. 7B shows an embodiment of the retopologized region. As shown, the reference curves 72 and 74 collectively provide a width for the faces of the retopologized region along the curves 72 and 74. The length of the faces of the retopologized region along the curves 72 and 74 is determined by the computer system based on, for example, dimensions of the faces 71 and 73.

To retopologize the region bounded by the retopologized regions shown in FIG. 7B, in response to an indication from the designer, the computer system may automatically retopologize the region according to aspects of methods discussed herein. Alternatively, the designer may provide an indication to the computer system, where the indication communicates start and end geometries of the region to be retopologized, and in response to the indication, the computer system retopologizes a region between the start and end geometries according to, for example, aspects of methods discussed herein.

Figure 7C:
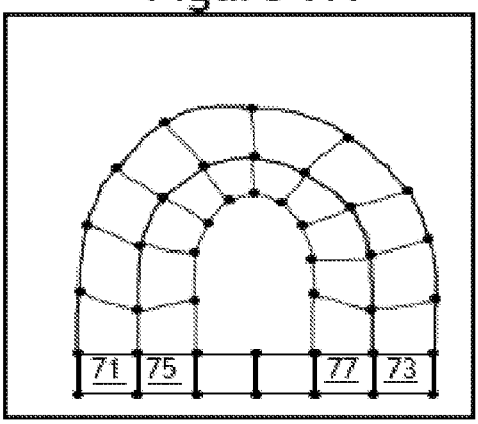

For example, as shown in FIG. 7C, the computer system may retopologize a region starting with face 75 and ending with face 77 in response to an indication received from the designer communicating faces 75 and 77 as the start and end geometries. In this embodiment, the computer system determines that certain edges of each of faces 76 and 77 are part of a preexisting flow line. The computer system causes the edges and vertices along the preexisting flow line to be used for bounding faces of the retopologized region from face 75 to face 77. The computer system also determines a second flow line which connects faces 75 and 77, and which includes edges of faces 75 and 77 which are difference than the edges of faces 75 and 77 which are part of the preexisting flow line. The computer system generates edges and vertices along the second flow line to be used for bounding faces of the retopologized region from face 75 to face 77.

In some embodiments, to provide the indication communicating faces 75 and 77 as the start and end geometries the designer may mouse click on either of faces 75 and 77, hold the mouse button down, traverse a curve with the mouse cursor, and release the mouse button on the other of the faces 75 and 77. The curve traversed by the mouse cursor after mouse clicking and before releasing the mouse button defines a path for the series of retopologized faces from face 75 to face 77. In such embodiments, because the path is near the retopologized path from face 71 to face 73, the computer system uses the edges and vertices along the preexisting flow line from face 71 to face 73 to be used for bounding faces of the retopologized region from face 75 to face 77. In some embodiments, if the path is nearer to the retopologized path from face 71 to face 73 than the width of or about half the width of the faces to be generated, the computer system uses the edges and vertices along the retopologized region from face 75 to face 77. In some embodiments, the path defines or approximately defines a flow line for edges of the series of retopologized faces.

Figure 7D:
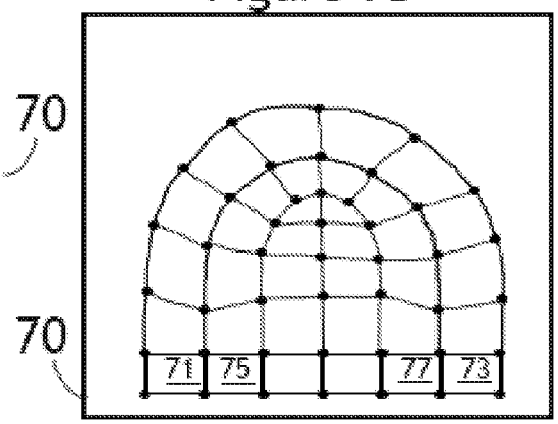

The remaining unretopologized region, shown in FIG. 7C, may be retopologized as shown in FIG. 7D using a manual method or using an automatic method discussed herein.

Figure 8A:
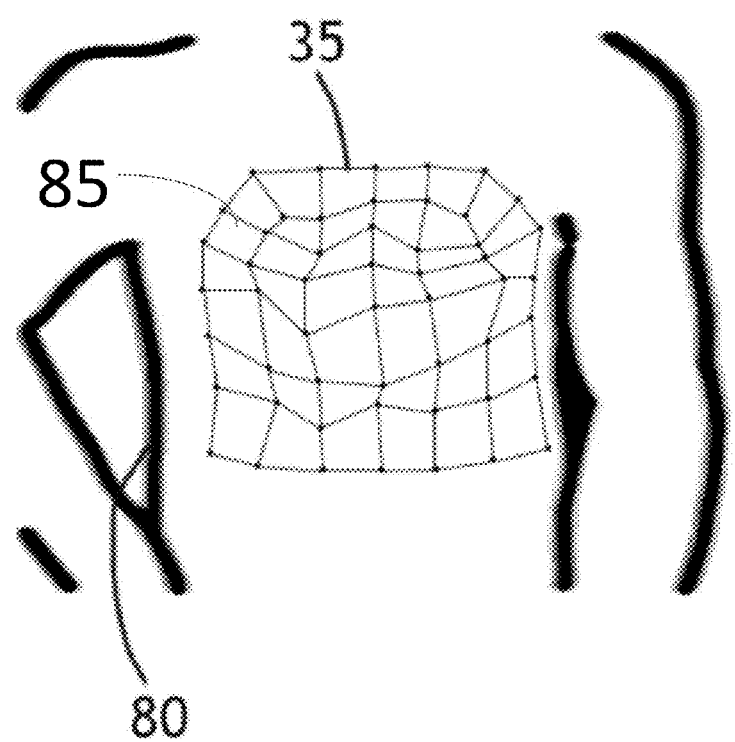
FIGS. 8A and 8B are illustrations of a retopologized region of data object before and after optimizing the geometries of the region.
Figure 8B:
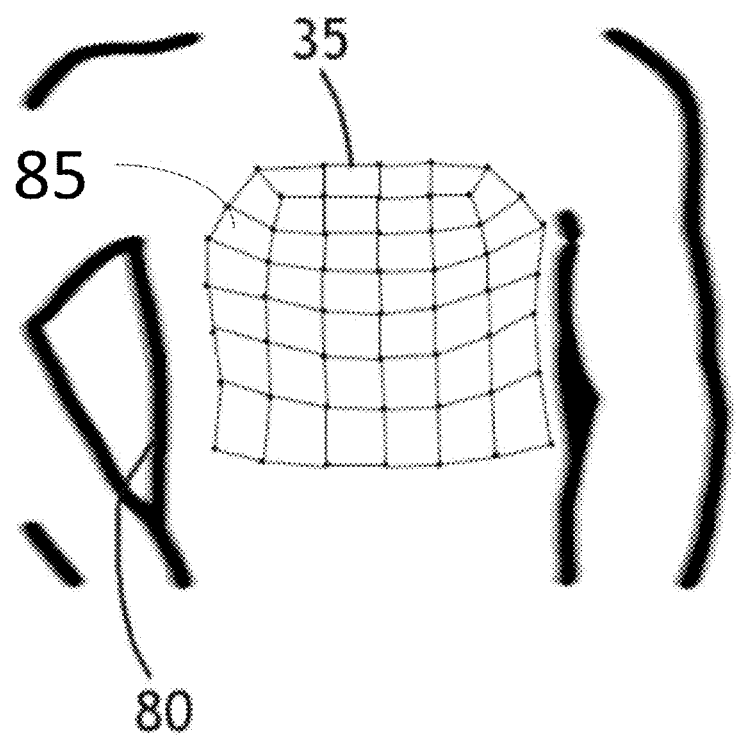

The methods discussed herein may generate retopologized data which may have a wide range of face sizes and shapes. Accordingly, flow lines may not be smooth, and unnecessarily sharp and obtuse angles may be generated at some vertices. Accordingly, once a region has been retopologized, in some embodiments, a geometry optimizing process is performed FIGS. 8A and 8B respectively show illustrations of a retopologized region 85 of data object 80 before and after optimizing the geometries of the region.

In some embodiments, in response to an indication from the designer, the computer system optimizes the retopologized region 85. For example, in some embodiments, the computer system repositions the vertices of the retopologized region 85 which are not on the boundary of the region. To reposition a vertex, the computer system determines a position for the vertex based on the retopologized region 85 and on the surface of the data object 80.

In some embodiments, the computer system selects a point on the data object 80 for each vertex and moves the vertex to that point. In some embodiments, the point on the data object 80 to which a vertex is moved is not on the surface defined by retopologized data 85. The selected point on the data object 80 may be selected, for example, based on the edge Lengths of the edges connected to the repositioned vertex. In some embodiments the distribution of the edge lengths is minimized. In some embodiments, the vertex is moved to a position on data object 80 between its previous position and the point of minimized length distribution. The selected point on data object 80 may be selected using additional and/or alternative criteria.

In some embodiments, the computer system sequentially repositions all of the Interior vertices of retopologized data 85. In some embodiments, the computer system repeatedly or iteratively repositions the sequence of vertices, for example, until no vertex is moved greater than a threshold. In some embodiments, the sequence of vertices is altered for one or more iterations.

The various aspects, processes, and actions discussed herein may be performed sequentially or in parallel. For example, a system capable of parallel processing may divide certain procedures among the available processing devices. In addition, the various aspects, processes, and actions may be performed automatically or algorithmically by the computer system according to a program running on the computer system.

While various aspects, processes, actions, and systems have been described as being included in the embodiments discussed, the various aspects, processes, actions, and systems can be practiced with certain modifications. For example, the sequential order of the various aspects, processes, and actions may be modified. In addition, certain aspects, processes, and actions may be omitted, and other aspects, processes, and actions may be added.

What is claimed is:

1. A method of producing an electronic geometric model with a computer system, the method comprising:
   accessing electronic data, the electronic data comprising polygonal data representing a surface;
   receiving an indication from a user; the indication indentifying first and second vertices; and
   in response to the indication, automatically retopologizing a region of the polygonal data, wherein the automatically retopologized region comprises a plurality of faces and a plurality of edges,
   wherein retopologizing the region comprises:
   the computer system adding additional vertices to the polygonal data,
   wherein the additional vertices defines a plurality of quadrilaterals,
   the computer system determining whether a next pair of potential additional vertices would cause a next potential quadrilateral to encompass a region of the polygonal data having a topology greater than a threshold, the next potential quadrilateral having edges of a length approximately equal to the distance between the first and second vertices,
   in response to the next pair of potential additional vertices causing the next potential quadrilateral to encompass a region having topology less than the threshold, the computer system adding next vertices to the polygonal data, wherein the next vertices partially define an additional quadrilateral, wherein each of the edges of the additional quadrilateral has a length about equal to the distance between the first and second vertices, and in response to the next pair of potential additional vertices causing the next potential quadrilateral to encompass a region having topology greater than the threshold, the computer system adding next vertices to the polygonal data, wherein the next vertices partially define an additional quadrilateral, wherein one or more edges of the additional quadrilateral has a length different from the distance between the first and second vertices.

2. The method of claim 1, wherein the indication comprises placing the second vertex of the first and second vertices sequentially added to the polygonal data.

3. The method of claim 1, wherein retopologizing the region further comprises:
the computer system adding the additional vertices to the polygonal data until a bounded region is retopologized, wherein the bounded region is bounded by one or more of:
a region having topology greater than the threshold,
a boundary of the polygonal data, and
a previously retopologized region.

4. The method of claim 1, further comprising placing the additional vertices such that the quadrilaterals defined thereby have approximately the same size and shape.

5. The method of claim 1, wherein the indication comprises placing an edge dragged from an edge connecting the first and second vertices of the polygonal data.

6. A method of producing an electronic geometric model with a computer system, the method comprising:
accessing electronic data, the data comprising polygonal data representing a surface;
receiving an indication from a user;
in response to the indication, automatically retopologizing a region of the polygonal data, wherein the automatically retopologized region comprises a plurality of faces and a plurality of edges,
wherein the indication comprises placing an edge dragged from an edge connecting first and second vertices of the polygonal data.

7. The method of claim 6, wherein retopologizing the region comprises:
the computer system adding additional vertices to the polygonal data, wherein the first, second, and additional vertices define a plurality of quadrilaterals.

8. The method of claim 7, wherein retopologizing the region further comprises:
the computer system adding the additional vertices to the polygonal data until a bounded region is retopologized, wherein the bounded region is bounded by one or more of:
a region having topology greater than the threshold,
a boundary of the polygonal data, and
a previously retopologized region.

9. The method of claim 6, wherein the indication comprises dragging an edge connecting the first and second vertices of the polygonal data greater than a fixed distance, wherein the fixed distance is approximately equal to the distance between the first and second vertices.

10. The method of claim 6, wherein retopologizing the region comprises:
the computer system adding an additional pair of vertices to the polygonal data for each fixed distance the edge is dragged, wherein each pair of additional vertices partially defines a next quadrilateral.

11. The method of claim 10, wherein the dragging of the edge defines a nonlinear curve, and wherein the each next quadrilateral is placed along the curve.

12. The method of claim 6, wherein the indication comprises dragging an edge connecting the first and second vertices of the polygonal data to a previously retopologized region.

13. The method of claim 12, wherein retopologizing the region comprises:
the computer system adding additional vertices to the polygonal data, wherein vertices of the retopologized region, the first, the second, and the additional vertices define a plurality of quadrilaterals.

14. The method of claim 6, further comprising receiving data identifying first and second previously retopologized regions, wherein retopologizing the region comprises:
the computer system adding additional vertices to the polygonal data along a path between the first and second retopologized regions, wherein the additional vertices define a plurality of quadrilaterals along the path.

15. A method of producing an electronic geometric model with a computer system, the method comprising:
accessing electronic data, the data comprising polygonal data representing a surface;
receiving an indication from a user; and
in response to the indication, automatically retopologizing a region of the polygonal data, wherein the automatically retopologized region comprises a plurality of faces and a plurality of edges, wherein retopologizing the region comprises the computer system adding additional vertices to the polygonal data, wherein the additional vertices define a plurality of quadrilaterals each defining four angles, and wherein the additional vertices are placed
such that the acuteness and obtuseness of the angles of the quadrilaterals are optimized.

16. The method of claim 15, wherein the additional vertices are placed such that a distribution of the lengths of the edges of the quadrilaterals is minimized.

17. The method of claim 15, wherein the additional vertices are placed and repositioned such that the acuteness and obtuseness is iteratively optimized.

18. A computer system, configured to:
access electronic data, the data comprising polygonal data representing a surface;
receiving an indication from a user;
in response to the indication, automatically retopologize a region of the polygonal data, wherein the automatically retopologized region comprises a plurality of faces and a plurality of edges, wherein retopologizing the region comprises adding a plurality of vertices to the polygonal data, wherein the vertices define a plurality of quadrilaterals, each defining four angles, and wherein the added vertices are placed such that the acuteness and obtuseness of the angles of the quadrilaterals are optimized.

19. The computer system of claim 18, wherein the additional vertices are placed such that a distribution of the lengths of the edges of the quadrilaterals is minimized.

20. The computer system of claim 18, wherein the additional vertices are placed and repositioned such that the acuteness and obtuseness is iteratively optimized.

21. A computer system, configured to:
access electronic data, the data comprising polygonal data representing a surface;
receiving an indication from a user, the indication identifying first and second vertices;

in response to the indication, automatically retopologize a region of the polygonal data, wherein the automatically retopologized region comprises a plurality of faces and a plurality of edges, wherein retopologizing the region comprises:

the computer system adding additional vertices to the polygonal data, wherein the additional vertices define a plurality of quadrilaterals, the computer system determining whether a next pair of potential additional vertices would cause a next potential quadrilateral to encompass a region of the polygonal data having a topology greater than a threshold, the next potential quadrilateral having edges of a length approximately equal to the distance between the first and second vertices, in response to the next pair of potential additional vertices causing the next potential quadrilateral to encompass a region having topology less than the threshold, the computer system adding next vertices to the polygonal data, wherein the next vertices partially define an additional quadrilateral, wherein each of the edges of the additional quadrilateral has a length about equal to the distance between the first and second vertices, and in response to the next pair of potential additional vertices causing the next potential quadrilateral to encompass a region having topology greater than the threshold, the computer system adding next vertices to the polygonal data, wherein the next vertices partially define an additional quadrilateral, wherein one or more edges of the additional quadrilateral has a length different from the distance between the first and second vertices.

22. The computer system of claim 21, wherein the indication comprises placing the second vertex of the first and second vertices sequentially added to the polygonal data.

23. The computer system of claim 21, wherein retopologizing the region further comprises:

the computer system adding the additional vertices to the polygonal data until a bounded region is retopologized, wherein the bounded region is bounded by one or more of:

a region having topology greater than the threshold,
a boundary of the polygonal data, and
a previously retopologized region.

24. The computer system of claim 21, further comprising placing the additional vertices such that the quadrilaterals defined thereby have approximately the same size and shape.

25. The computer system of claim 21, wherein the indication comprises placing an edge dragged from an edge connecting the first and second vertices of the polygonal data.

26. A computer system, configured to:

access electronic data, the data comprising polygonal data representing a surface;

receive an indication from a user;

in response to the indication, automatically retopologize a region of the polygonal data, wherein the automatically retopologized region comprises a plurality of faces and a plurality of edges, wherein the indication comprises placing an edge dragged from an edge connecting first and second vertices of the polygonal data.

27. The computer system of claim 26, wherein retopologizing the region further comprises:

the computer system adding additional vertices to the polygonal data until a bounded region is retopologized, wherein the bounded region is bounded by one or more of:

a region having topology greater than the threshold,
a boundary of the polygonal data, and
a previously retopologized region.

28. The computer system of claim 26, wherein the indication comprises dragging an edge connecting the first and second vertices of the polygonal data greater than a fixed distance, wherein the fixed distance is approximately equal to the distance between the first and second vertices.

29. The computer system of claim 26, wherein retopologizing the region comprises:

the computer system adding an additional pair of vertices to the polygonal data for each fixed distance the edge is dragged, wherein each pair of additional vertices partially defines a next quadrilateral.

30. The computer system of claim 26, wherein the indication comprises dragging an edge connecting the first and second vertices of the polygonal data to a previously retopologized region.

* * * * *